United States Patent [19]

Aoyama et al.

[11] Patent Number: 4,557,996
[45] Date of Patent: Dec. 10, 1985

[54] METHOD FOR PROVIDING A PATTERN-WISE PHOTORESIST LAYER ON A SUBSTRATE PLATE AND A SURFACE-PROTECTED SUBSTRATE PLATE THEREFOR

[75] Inventors: Toshimi Aoyama; Hiroyuki Tohda, both of Fujisawa; Kazuo Kato, Kanagawa; Hisashi Nakane, Kawasaki, all of Japan

[73] Assignee: Photopoly Ohka Co., Ltd., Kanagawa, Japan

[21] Appl. No.: 614,655

[22] Filed: May 29, 1984

[30] Foreign Application Priority Data

Jun. 7, 1983 [JP] Japan .................................. 58-101329

[51] Int. Cl.<sup>4</sup> ........................ G03C 5/44; G03C 1/727
[52] U.S. Cl. .................... 430/324; 430/269; 430/271; 430/326; 430/325; 430/510
[58] Field of Search ............... 430/312, 510, 269, 270, 430/271, 324, 325, 326

[56] References Cited

U.S. PATENT DOCUMENTS

| | | | |
|---|---|---|---|
| 2,902,365 | 9/1959 | Martin | 430/281 |
| 2,964,401 | 12/1960 | Plambeck | 430/281 |
| 3,873,331 | 3/1975 | Horst et al. | 430/312 |
| 3,934,057 | 1/1976 | Moreau et al. | 430/270 |
| 3,982,943 | 9/1976 | Feng et al. | 430/312 |
| 4,210,569 | 7/1980 | Sysjuk et al. | 430/512 |
| 4,352,879 | 10/1982 | Howard et al. | 430/271 |
| 4,369,246 | 1/1983 | Chen et al. | 430/281 |
| 4,427,759 | 1/1984 | Gruetzmacher et al. | 430/281 |
| 4,434,217 | 2/1984 | Master et al. | 430/271 |

Primary Examiner—Jack P. Brammer
Attorney, Agent, or Firm—Brisebois & Kruger

[57] ABSTRACT

The invention provides an improved method for the so-called dry-film process for forming a pattern-wise photoresist layer on the substrate surface in which a substrate is overlaid and laminated with a preformed film of a photosensitive composition called a dry film and photolithographically processed. In the inventive method, different from conventional dry-film processes, the substrate plate is first provided with a protecting layer of a photosensitive composition containing a halation inhibitor and the lamination with a dry film is performed without removing the protecting layer. After pattern-wise exposure to light, development of the photosensitive layer is undertaken by use of a developer solvent capable of dissolving both of the protecting layer and the pattern-forming layer. Despite the intervention of the protecting layer, the resolving power and image reproducibility are excellent.

10 Claims, 6 Drawing Figures

METHOD FOR PROVIDING A PATTERN-WISE PHOTORESIST LAYER ON A SUBSTRATE PLATE AND A SURFACE-PROTECTED SUBSTRATE PLATE THEREFOR

BACKGROUND OF THE INVENTION

The present invention relates to a method for providing a pattern-wise photoresist layer on a substrate plate and a surface-protected substrate plate therefor. More particularly, the invention relates to a method for forming a pattern-wise photoresist layer having excellent resolving power and image reproducibility on a surface-protected substrate plate in the so-called dry-film process without removing the surface protecting film from the substrate surface.

As is well known, photolithographic techniques are widely used in a variety of fields including the electronics industry such as the manufacture of printed circuit boards and other precision devices and elements by utilizing various types of photosensitive materials, among which the most conventional ones are those supplied in a liquid form such as a solution of a photosensitive resin for coating or those having an ink-like consistency suitable for silk-screen printing.

When a photosensitive layer is to be formed on the surface of a substrate plate, the photosensitive material in a liquid form is applied to the substrate surface by use of, for example, a roll coater, doctor knife and the like to give a desired thickness of the photosensitive layer. A problem in this case is that the photosensitive material in the liquid form usually has a consistency or solid content not so high as to give the desired thickness by a single coating after drying. The thickness of the dried photosensitive layer obtained by a single coating does not exceed usually 2 to 3 μm or, even in the case of a combination of the optimum conditions, 10 μm at the highest. When a large thickness of 30 to 50 μm is desired of the dried photosensitive layer on the substrate surface, therefore, the steps of coating and drying of a liquid photosensitive material must be repeated many times until the desired thickness of the dried photosensitive layer is obtained with large consumption of time and labor.

With an object to avoid the above mentioned practical difficulty in obtaining a relatively large thickness of the photosensitive layer on a substrate surface, the so-called dry-film process has been recently developed in which a lamination called a dry film is prepared in advance by providing a flexible base plate or sheet with a layer of a photosensitive material of a thickness as large as desired and a substrate having a smoothed surface is overlaid with the dry film under pressure through a hot roller with the photosensitive layer in direct contact to the substrate surface so that the photosensitive layer is adhesively bonded to the substrate surface to be ready for pattern formation. Several methods of the dry-film process have been proposed hitherto including a method in which a dry film is directly laminated with the substrate plate followed by image-forming exposure to light and development (see, for example, Japanese Patent Publication No. 45-25231) and a method in which the dry film is provided with a layer of an adhesive by means of which the dry film is adhesively bonded to the substrate surface (see, for example, Japanese Patent Kokai No. 52-154363).

Turning now to the problem encountered in the storage and handling of photolithographic substrate plates, for example, for the manufacture of printed circuit boards, the substrate surface is not rarely subject to contamination and mechanical damage or surface oxidation to adversely affect the adhesiveness with the dry film and the performance in etching. Therefore, it is usual that substrate plates before use are provided with a surface-protecting film which prevents contamination, mechanical damage and oxidation of the substrate surface. The formulation or composition of the protecting film of course involves a difficult technical problem to be solved because such a protecting film must have adequate adhesion to the substrate surface and satisfy other requirements. For example, poor adhesion of the protecting film to the substrate surface results in falling off of the film during storage or transportation with consequent loss of the protection while a protecting film of too strong adhesion must be removed with great difficulties prior to the use of the substrate plate. Alternatively, a substrate surface may be protected by coating with a grease or the like protecting agent in place of the protecting film. The protection provided by such a protecting agent is, however, not quite effective to protect the substrate surface from mechanical damages and, moreover, the greasy protecting layer must be completely removed by washing prior to use of the substrate plate to cause great troublesomeness.

It has been eagerly desired therefore to develop a novel dry-film process by use of a surface-protected substrate plate free from the above described problems and disadvantages in the prior art method and the inventors have continued extensive investigations therefor arriving at the establishment of the present invention described below in detail.

SUMMARY OF THE INVENTION

An object of the present invention is therefore to provide a novel and efficient dry-film process in which a pattern-wise photoresist layer of high resolving power and good image reproducibility is formed on the substrate surface without removing the protecting film from the substrate surface.

Another object of the invention is accordingly to provide a surface-protected substrate plate which can be used in the dry-film process without removing the protecting film prior to use.

Thus, the surface-protected photolithographic substrate plate of the invention comprises a substrate plate and a protecting layer provided on at least one of the substrate surfaces, said protecting layer being formed of a photosensitive material containing a halation inhibitor. The type, i.e. positive or negative, of the photosensitivity of the photosensitive material should desirably be the same as that of the photosensitive material of which the pattern-wise photoresist layer is formed and the solubility behavior of the former should desirably be the same as that of the latter to be soluble in one and the same solvent.

The method of the present invention for providing a pattern-wise photoresist layer on a surface-protected substrate plate comprises the steps of:
(a) forming a protecting layer of a first photosensitive material containing a halation inhibitor on at least one of the surfaces of a substrate plate;
(b) overlaying the thus surface-protected substrate plate in lamination on the protecting layer with a preformed film of a second photosensitive material for pattern formation without removing the protecting layer;

(c) exposing the layer of the second photosensitive material pattern-wise to light; and (d) developing the thus pattern-wise exposed photosensitive layer with a developer liquid capable of dissolving both of the first and the second photosensitive materials on the areas either exposed or unexposed to light.

DETAILED DESCRIPTION OF THE PREFERRED EMBODIMENTS

Figure 1A:
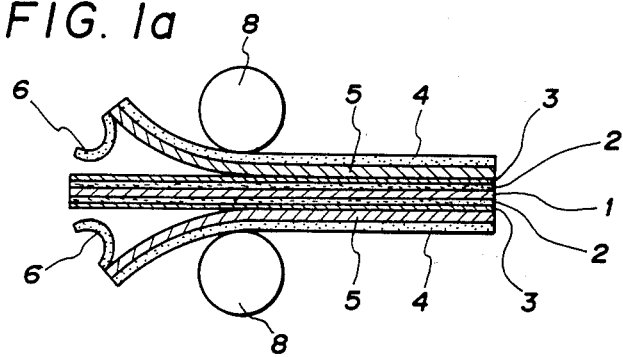
FIGS. 1a to 1e give a schematic illustration of the principle of the inventive method according to the sequence of steps showing a cross section of the layers in each step.

The types or materials of the substrate plates used in the inventive method are not particularly limitative and any one of those conventionally used in printed circuit boards and other electronic elements may be used including, for example, plates of metals such as copper and aluminum, silicon, sintered titanium dioxide, tantalum oxide, glass, epoxy resins, polyimide resins, paper boards, phenolic resins and other insulating materials as well as those insulating plates laminated with a foil of a metal such as copper, silver, aluminum and the like. The thickness and size of the substrate plate are also not limitative according to need.

The inventive surface-protected substrate plate is prepared by providing a protecting layer on at least one of the surfaces of the substrate plate and the substrate plate is overlaid with a so-called dry film in lamination with the surface of the photosensitive layer in direct contact with the protecting layer on the substrate plate. A dry film is a form of a photosensitive material prepared by providing a flexible base plate or sheet on one surface thereof with a layer of a photosensitive material having a thickness as large as desired sometimes reaching several tens of micrometers. The material of the base plate or sheet is not particularly limitative provided that the material has good flexibility suitable for processing in the dry-film process including metal foils and sheets of synthetic resins such as polyamides, polyolefins, polyesters, polyvinyl chlorides, papers and the like. The material, however, should preferably be transparent in view of the convenience of exposing the photosensitive layer pattern-wise in the above mentioned step (c) without removing the base plate or sheet. In this regard, polyester resins or, in particular, polyethylene terephthalate resins are preferred.

The photosensitive material of which the photosensitive layer is formed on one of the surfaces of the flexible base plate or sheet can be either of the negative type, i.e. the type of a photosensitive material insolubilized by exposure to light, or of the positive type, i.e. the type of a photosensitive material imparted with an increased solubility by exposure to light. Exemplary of the negative type photosensitive materials are photo-crosslinkable polymers such as cinnamic acid esters of high-molecular polyols, polyvinyl cinnamate, polyvinyl anisyl acetophenone and the like and compositions composed of a polymeric component such as polyacrylamide, polyols, gelatin and the like and a photosensitizing component such as a metal bichromate, diazo compound, azide compound and the like as well as compositions composed of a cyclized rubber and a bisazide with optional admixture of a small amount of an epoxy acrylate.

Particularly preferable negative type photosensitive compositions are formed by the combinations of a base polymer, selected from the copolymers of methyl methacrylate and methyl acrylate, methyl methacrylate and styrene, ethyl methacrylate and styrene, methyl acrylate and acrylonitrile, ethyl acrylate and acrylonitrile, methyl acrylate, styrene and acrylonitrile, methyl acrylate and butyl methacrylate, ethyl acrylate and butyl methacrylate, methyl methacrylate and acrylic acid, methyl methacrylate and β-hydroxyethyl acrylate and methyl methacrylate, β-hydroxypropyl acrylate and methacrylic acid, poly(methacrylic acid/epoxy acrylate) and poly(methacrylic acid/epoxy acrylate/methacrylic acid) as well as copolymers of at least one of the above named compounds and polyacrylated urethane, with an active component which is an acrylic photopolymerizable compound, such as polyalkyleneglycol, i.e. poly-(ethylene-propylene)glycol, diacrylates and dimethacrylates having an average degree of polymerization of 2 to 200, diacrylates and dimethacrylates of ethyleneglycol and polyethyleneglycol having an average degree of polymerization of 200 or smaller, monoacrylates and monomethacrylates of ethyleneglycol and polyethyleneglycol having an average degree of polymerization of 200 or smaller, urethane diacrylate and dimethacrylate, diacrylates and dimethacrylates of an alkylenediamine and polyalkylenediamine having an average degree of polymerization of 10 or smaller, epoxy acrylate having an average degree of polymerization of 1 to 10, pentaerithritol triacrylate and trimethacrylate and the like as well as mixtures thereof.

The above named photosensitive compositons are usually admixed, in addition to the above mentioned active components, with a photopolymerization initiator such as anthraquinone, methylanthraquinone, chloroanthraquinone, 2-ethylantraquinone, 2-tert-butylanthraquinone, benzanthraquinone, benzoin, bonzoin isopropyl ether, benzil, benzophenone, Michler's ketone and the like and a thermal polymerization inhibitor such as hydroquinone, methylhydroquinone and the like. It is of course optional that the photosensitive composition is further admixed with a coloring agent, plasticizer and the like additives.

Exemplary of the positive type photosensitive compositions are those developable with an alkali solution comprising a combination of o-benzoquinone diazide or 1,2-naphtoquinone diazide and an alkali-soluble phenol novolac resin as the active ingredient (see, for example, Japanese Patent Publication No. 37-18015) and those containing shellac or a copolymer of styrene and maleic anhydride in place of the alkali-soluble phenol novolac resin in the above mentioned compositions (see, for example, Japanese Patent Publication No. 37-3627).

In connection with the photosensitive material to form the protecting layer provided on the substrate surface, it is essential that the solubility behavior of the protecting layer should be the same as or similar to that of the photosensitive layer for patterning so as to be dissolved away in the development together with the overlying photosensitive layer for patterning by the developer liquid after exposure to light. In this regard, the photosensitive material for the protecting layer preferably may be the same one as or a similar one to the photosensitive composition forming the layer for patterning. In particular, it is advantageous that the former has a somewhat higher solubility than the latter in the same developer liquid.

It is essential that the protecting layer on the substrate surface should contain a halation inhibitor in order to improve the resolving power and the image reproducibility for accurate reproduction of any fine patterns. The type of the halation inhibitor is not particularly limitative provided that, in addition to the compatibility with the photosensitive material, good absorption of light is obtained in the wavelength region of 280 to 430 nm covering the sensitivity range of the photosensitive material. Exemplary of such a halation inhibitor are organic dyes including acridine dyes, Aniline Black, anthraquinone dyes, azine dyes, e.g. C.I. Solvent Balck 5 and C.I. Solvent Black 7, azo dyes, azomethine dyes, benzoquinone dyes, naphthoquinone dyes, indigoid dyes, indophenol, indoaniline, indamine, leuco vat dye esters, naphtholimide dyes, nitro and nitroso dyes, oxazine and dioxazine dyes, oxidation dyes, phthalocyanine dyes, polymethine dyes, quinophthalone dyes, sulfur dyes, triarylmethane and diarylmethane dyes, thiazine dyes, thiazol dyes and xanthine dyes, inorganic and organic pigments and ultraviolet absorbers including phenyl salicylate and derivatives thereof, benzophenone and derivatives thereof and certain acrylate compounds. The amount of the halation inhibitor in the photosensitive composition should be in the range from 0.001 to 10% by weight or, preferably, from 0.05 to 2% by weight based on the total amount of the resin forming the protecting layer.

The essential advantage in the inventive method is that the troublesome procedure of removing the protecting layer on the substrate plate can be entirely omitted. That is, the dry film bearing the pattern-forming photosensitive layer is put directly on the surface-protected substrate plate in lamination without removing the protecting layer thereon. Despite the intervention of such a protecting layer between the substrate surface and the pattern-forming photosensitive layer, the resolving power of the patterned image and the image reproducibility are not decreased according to the present invention. Therefore, a great saving is achieved in the time and labor for the removal of the protecting layer from the substrate surface prior to lamination with the dry film and, in addition, the image lines of the patterned photoresist layer are freed from the adverse influences by the fine ruggedness or irregularities on the substrate surface so that the pattern-wise exposure and development of the photosensitive layer and etching to follow can be performed with high accuracy resulting in an increased yield of acceptable products.

The procedure of the pattern-wise exposure to light and development of the photosensitive layer can be performed according to the conventional procedure undertaken in the photoetching techniques. It is essential in the inventive method that the developer liquid or solution can dissolve both of the pattern-forming photosensitive layer and the protecting layer in the unexposed areas (when the photosensitive materials in both layers are of the negative type) or in the exposed areas (when the photosensitive materials are of the positive type). Although suitable developer liquid or solution should be selected of course depending on the types of the photosensitive compositions forming the pattern-forming layer and the protecting layer, it is usually selected from aqueous alkali solutions, alcoholic solvents, ketones, hydrocarbons and halogenated hydrocarbons as well as mixtures thereof.

In the next place, the procedure of the inventive method is described according to the sequence of the steps with reference to FIGS. 1a to 1e of the accompanying drawing illustrating an embodiment of the inventive method each by the cross section of the layered structure. FIG. 1a illustrates the step of lamination in which a substrate plate foiled and protected on both surfaces of an insulating plate 1 each with a copper foil 2 and a protecting layer 3 of a photosensitive composition containing a halation inhibitor on the copper foil and having a thickness of 0.5 to 20 μm or, preferably, 1 to 10 μm is sandwiched with two dry films each composed of a base film 4 of, for example, transparent polyester resin and a layer 5 of a pattern-forming photosensitive composition and pressed by and between a pair of laminating rollers 8,8 after peeling of the temporary protecting film 6 of, for example, polyethylene of the photosensitive layer of the dry film so that the dry films are adhesively bonded to the substrate plate with the photosensitive layers 5,5 in direct contact with the respective protecting layers 3,3.

Figure 1B:
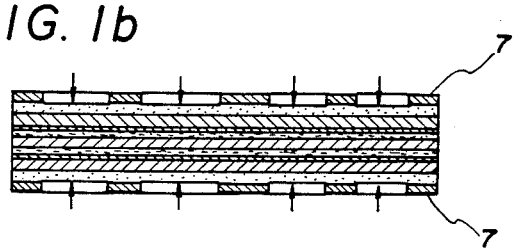

FIG. 1b is to illustrate the pattern-wise exposure of the photosensitive layers 4,4, to light. The lamination of the surface-protected substrate plate 1,2,3 and the dry films 4,5 is then directly contacted on both surfaces each with a transparency or photomask 7 bearing an image pattern and irradiated with light (indicated by the arrows) so that the photosensitive layers 5,5 contacting the transparent areas (white portions) of the transparency 7,7 are exposed to the light forming a pattern-wise latent image in the photosensitive layers 5,5 to be imparted with a solubility different from that in the unexposed areas. When the base film 4 is sufficiently transparent as in a polyester film, this exposure can be performed through the base films 4,4 left unremoved while it is of course that a base film 4 formed of an opaque material such as a metal foil must be removed prior to exposure to light.

Figure 1C:
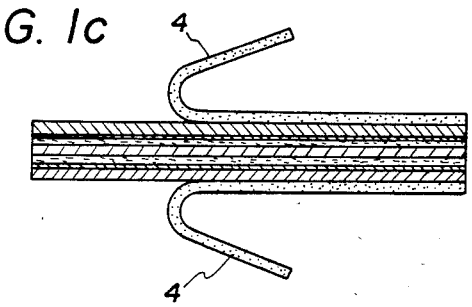
Figure 1D:
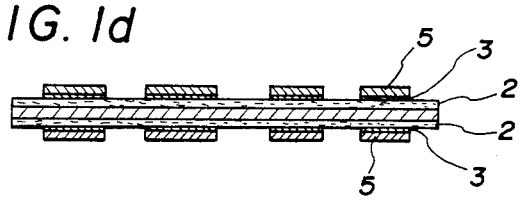
Figure 1E:
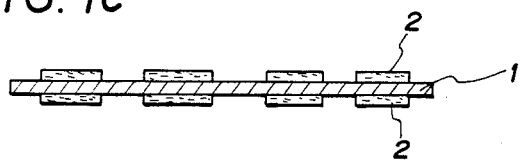

The lamination thus provided with pattern-wise latent images in the photosensitive layers 5,5 is then freed from the base films 4,4 as is illustrated in FIG. 1c and subjected to a development treatment with a suitable developer liquid or solution so that the photosensitive compositions of the protecting layers 3,3 and the pattern-forming photosensitive layers 5,5 are simultaneously dissolved away in the unexposed areas (when the photosensitive compositions are of the negative type) or in the exposed areas (when the photosensitive materials are of the positive type) to have the surfaces of the copper foils 2,2 exposed bare in a pattern-wise manner, other areas being protected by the photoresist layer, as is illustrated in FIG. 1d. The following steps of the etching of the thus partially uncovered copper foils 2,2 and the removal of the photoresist layers are conventional and need not be described in further detail resulting in the printed circuit board illustrated in FIG. 1e with the unetched copper foils 2,2 providing the circuit pattern.

According to the method of the invention, not only currently available commercial products of dry films but also any photosensitive materials with relatively poor adhesiveness can be used for lamination on a surface-protected substrate plate as such with sufficient adhesive strength and the adverse influences caused by the scratches and hit marks on the substrate surface can be mitigated by virtue of the intervention of the protecting layer. Furthermore, an additional advantage is obtained when the substrate plate is provided with a through-hole. That is, a technique of so-called tenting has been indispensable in such a case in the prior art method using a dry film alone to cover the opening taking a land area considerably larger than the area of the opening in order to support the dry film on the opening while, in the inventive method, such a land area can be much smaller than in the prior art so that the wiring density of the printed circuit can be increased so much.

Moreover, the protecting layer on the substrate surface also serves as an adhesive layer for the dry film laminated thereon so that the drawback of falling of the dry film during processing sometimes caused in the prior art process can be greatly reduced. In addition, the simultaneous removal of the protecting layer in the development has an effect to prevent undercutting and the like undesirable phenomenon reducing the resolving power. Therefore, the method of the invention is advantageous also from the standpoint of increasing the yield of the acceptable products in addition to the great saving of time and labor for the production of the individual products.

Following are the examples to illustrate the invention in more detail.

EXAMPLE 1

A viscous liquid photosensitive composition of green color was prepared by uniformly blending 500 parts by weight of a 90:10 by weight copolymer of methyl methacrylate and methyl acrylate, 150 parts by weight of tetraethyleneglycol diacrylate, 25 parts by weight of a bisphenol A-type epoxy diacrylate of n=ca. 5, 25 parts by weight of 2-ethylanthraquinone, 0.025 part by weight of 4-methoxyphenol, 3 parts by weight of malachite green as a halation inhibitor and 1000 parts by weight of ethyleneglycol monoethyl ether acetate.

A substrate plate foiled on both surfaces each with a copper foil of mat surface was coated on both surfaces with the above prepared liquid photosensitive composition by use of a double-side roll coater followed by drying to give protecting layers of a varied thickness of up to 5-6 μm. Each of the protecting layers was then overlaid and laminated with a dry film (Ordyl 2520, a product by Tokyo Ohka Kogyo Co.) in a laminating velocity of 65 cm/minute at a varied temperature of 20° to 130° C.

A positive-type photomask of a fine line pattern was contacted with each of the dry fims on the substrate plate and the photosensitive layer of the dry film was irradiated through the photomask for 1 minute with ultraviolet light by use of an ultra-high pressure mercury lamp of 2 kilowatt output as the light source followed by the development with showering of 1,1,1-trichloroethane as the developer. Both of the photosensitive layer of the dry film and the protecting layer were dissolved away by the developer on the areas not exposed to the light. The resolving power and the image reproducibility obtained in the above described tests with a protecting layer having a thickness of 2-3 μm or 5-6 μm are shown in the table given below and FIG. 2 of the accompanying drawing together with the comparative results obtained without providing a protecting layer on the substrate plate.

Figure 2:
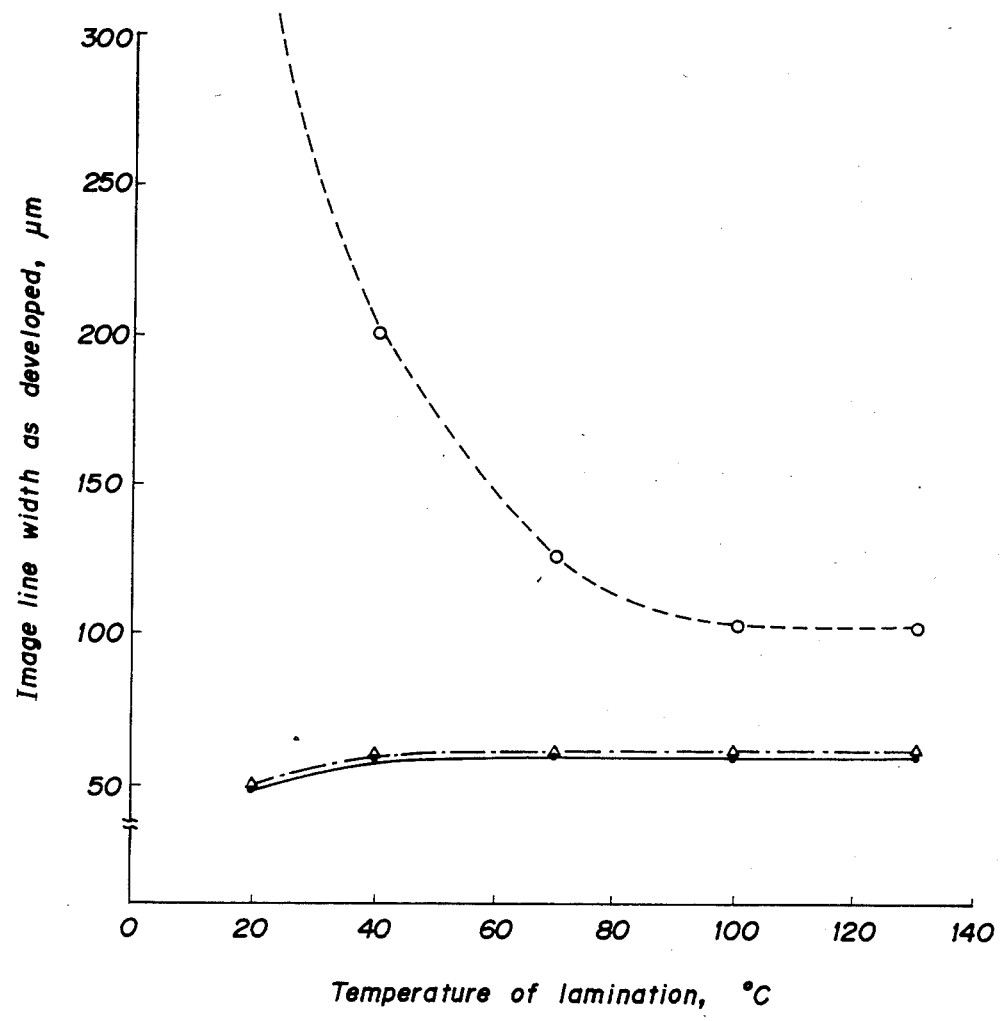
FIG. 2 is a graph showing the relationship between the width of image lines of a patterned photoresist layer after development and the temperature at which a dry film is laminated with a surface-protected or unprotected substrate plate.

The table gives the results by the differentiation whether or not a line-wise pattern of the photoresist layer was formed for each of the line widths on the photomask of 50 to 200 μm when the laminating temperature was varied in the range from 20° to 130° C. The symbols A and B denote success and failure in the line-wise photoresist formation, respectively. FIG. 2 is a graphic showing of the minimum line widths of the patterned photoresist layers successfully obtained with line resolution as a function of the temperature at which the lamination of the substrate plate and the dry film was performed. The solid line and the chain line are for the thickness of the protecting layer of 5-6 μm and 2-3 μm, respectively, and the broken line is for the tests without the protecting layer.

TABLE

| Temperature of lamination, °C. | Thickness of protecting layer, μm | Line width, μm | | | | | | |
|---|---|---|---|---|---|---|---|---|
| | | 50 | 60 | 80 | 100 | 125 | 150 | 200 |
| 130 | 0 | B | B | B | A | A | A | A |
| | 2-3 | B | A | A | A | A | A | A |
| | 5-6 | B | A | A | A | A | A | A |
| 100 | 0 | B | B | B | A | A | A | A |
| | 2-3 | B | A | A | A | A | A | A |
| | 5-6 | B | A | A | A | A | A | A |
| 70 | 0 | B | B | B | B | A | A | A |
| | 2-3 | B | A | A | A | A | A | A |
| | 5-6 | B | A | A | A | A | A | A |
| 40 | 0 | B | B | B | B | B | B | A |
| | 2-3 | B | A | A | A | A | A | A |
| | 5-6 | B | A | A | A | A | A | A |
| 20 | 0 | B | B | B | B | B | B | B |
| | 2-3 | A | A | A | A | A | A | A |
| | 5-6 | A | A | A | A | A | A | A |

EXAMPLE 2

A green, viscous photosensitive liquid composition was prepared in the same formulation as in Example 1. This liquid composition was applied by use of a roll coater to a clean laminated plate copper-foiled on both surfaces followed by drying to give a protecting layer of 4 μm thickness on one of the surfaces of the substrate plate. The other suface of the substrate was also provided with a protecting layer in the same manner. Each of the protecting layers was directly laminated with a Laminar film having a photosensitive layer of 25 μm thickness (a dry film manufactured by Dynachem Co.) at a temperature of 100° to 110° C. at a laminating velocity of 65 cm/minute. Despite the omission of preheating, the adhesion of the Laminar film to the protecting layer was very firm and they could not be separated at all by the mechanical peeling procedure conventionally undertaken in the adhesion test of a dry film.

The pattern-wise exposure of the photosensitive layers to ultraviolet and development were carried out in the same manner as in Example 1 to find that both of the photosensitive layer of the Laminar film and the protecting layer were dissolved away on the unexposed areas by the developer to expose the underlying copper foils. After thorough rinse with water and pretreatment for metal plating, the plate was subjected to successive plating treatments with copper pyrophosphate and a high-throwing power solution for soldering. The results were quite satisfactory with neatness at the edges of the plated lines and no intrusion of the plating materials was found below the photoresist layer.

EXAMPLE 3

A viscous liquid photosensitive composition of violet color was prepared by uniformly blending 600 parts by weight of a 70:10:20 by weight copolymer of methyl methacrylate, butyl methacrylate and 2-hydroxyethyl acrylate, 60 parts by weight of tetraethyleneglycol diacrylate, 180 parts by weight of diallyl phthalate, 30 parts by weight of 2-tertbutyl anthraquinone, 0.03 part by weight of 4-methoxyphenol, 3 parts by weight of Ethyl Violet as a halation inhibitor and 1000 parts by weight of ethyleneglycol monoethyl ether.

The same procedure as in Example 2 was undertaken for the preparation of a double-side printed circuit board excepting the use of the above prepared liquid composition for the protecting layers to find that both of the photosensitive layer of the Laminar film and the protecting layer were dissolved away by the showering with 1,1,1-trichloroethane as the developer to leave a pattern-wise photoresist layer which was also highly resistant against the plating solution as in Example 2.

EXAMPLE 4

A photosensitive liquid composition of violet color was prepared by uniformly blending 200 parts by weight of an epoxy dimer (Epikote 1001, a product by Shell Chemical Co.), 40 parts by weight of diallyl phthalate, 10 parts by weight of triethyleneglycol diacrylate, 10 parts by weight of diethyleneglycol diacrylate, 20 parts by weight of benzoin isopropyl ether, 5 parts by weight of 2-ethyl anthraquinone, 0.01 part by weight of 4-methoxyphenol, 2 parts by weight of Ethyl Violet as a halation inhibitor and 800 parts by weight of methyl ethyl ketone.

A copper-foiled laminated plate as a substrate was coated with the above prepared liquid composition by use of a dip-coater at a pulling-up velocity of 20 cm/minute followed by drying to form a semi-solid dried layer of the composition having a thickness of about 2 μm as a protecting layer. This protecting layer was overlaid and laminated with a dry film (Riston film, a product by Du Pont Co.) having a photosensitive layer of 50 μm thickness followed by exposure to light and development in the same manner as in the preceding examples to form a patterned photoresist layer. The plate thus provided with the pattern-wise photoresist layer was then subjected to a gold plating in an acidic condition after a pretreatment in the conventional manner. The printed circuit board thus obtained was absolutely free from the intrusion of the plating material below the photoresist layer in contrast to the printed circuit boards prepared in a conventional procedure without providing the protecting layer between the substrate surface and the dry film unavoidably resulting in remarkable intrusion of the plating gold below the photoresist layer.

EXAMPLE 5

A photosensitive liquid composition was prepared with the same formulation as in Example 4 except that the methyl ethyl ketone was replaced with the same amount of ethyleneglycol monoethyl ether. This liquid composition was used for providing a protecting layer of about 2 μm thickness as dried on each of the copper-foiled surfaces of a laminated plate having a through-hole by use of a roll coater. After drying, the plate was laminated with a dry film on each of the surfaces and subjected to through-hole patterning exposure followed by development on both surfaces with 1,1,1-trichloroethane as the developer and etching with an iron (III) chloride solution to give a copper-foil printed circuit board with a through-hole in which the through-hole opening was fully protected by a tenting membrane.

What is claimed is:

1. A method for providing a pattern-wise photoresist layer on a substrate plate which comprises the steps of:
   (a) forming a first layer of a first positive photosensitive composition containing a halation inhibitor on at least one surface of a substrate plate;
   (b) then bonding onto the first layer a preformed dry film of a second positive photosensitive composition;
   (c) exposing the film of the second composition with pattern-wise light while simultaneously exposing said first layer to said pattern-wise light, through the second layer; and
   (d) dissolving the thus pattern-wise exposed photosensitive film and first layer with a developer liquid capable of dissolving the exposed areas of the first and the second photosensitive compositions,
   wherein the halation inhibitor in the first photosensitive composition is an organic dye or pigment compatible with the photosensitive composition and absorbing light in the wavelength range from 280 to 430 nm, and
   wherein the amount of halation inhibitor in the first photosensitive composition is in the range from 0.001 to 10% by weight.

2. The method of claim 1 wherein said first layer comprises a protective layer for protecting the surface of the substrate plate from mechanical damage and contamination prior to bonding the dry film onto the first layer.

3. The method as claimed in claim 1 wherein the first layer has a thickness in the range from 0.5 to 20 μm.

4. The method as claimed in claim 1 wherein the amount of halation inhibitor in the first photosensitive composition is in the range of 0.05 to 2% by weight.

5. The method of claim 1 wherein said step (a) of forming a first layer comprises coating the plate with the first photosensitive material in liquid form and drying the coating.

6. A method for providing a pattern-wise photoresist layer on a substrate plate which comprises the steps of:
   (a) forming a first layer of a first negative photosensitive composition containing a halation inhibitor on at least one surface of a substrate plate;
   (b) then bonding onto the first layer a preformed dry film of a second negative photosensitive composition;
   (c) exposing the film of the second composition with pattern-wise light while simultaneously exposing said first layer to said pattern-wise light, through the second layer; and
   (d) dissolving the thus pattern-wise unexposed photosensitive film and first layer with a developer liquid capable of dissolving the unexposed areas of the first and the second photosensitive compositions,
   wherein the halation inhibitor in the first photosensitive composition is an organic dye or pigment compatible with the photosensitive composition and absorbing light in the wavelength range from 280 to 430 nm, and
   wherein the amount of halation inhibitor in the first photosensitive composition is in the range from 0.001 to 10% by weight.

7. The method of claim 6 wherein said first layer comprises a protective layer for protecting the surface of the substrate plate from mechanical damage and contamination prior to bonding the dry film onto the first layer.

8. The method as claimed in claim 6 wherein the first layer has a thickness in the range from 0.5 to 20 μm.

9. The method as claimed in claim 6 wherein the amount of halation inhibitor in the first photosensitive composition is in the range of 0.05 to 2% by weight.

10. The method of claim 6 wherein said step (a) of forming a first layer comprises coating the plate with the first photosensitive material in liquid form and drying the coating.

* * * * *